United States Patent
Luo et al.

(10) Patent No.: US 12,378,880 B2
(45) Date of Patent: Aug. 5, 2025

(54) FLUID MODELING WITH NANO-SCALE PORE SIZE EFFECTS FOR A RESERVOIR

(71) Applicant: Chevron U.S.A. Inc., San Ramon, CA (US)

(72) Inventors: Sheng Luo, Austin, TX (US); Dengen Zhou, Sugar Land, TX (US); Shihao Wang, Houston, TX (US); Xundan Shi, Katy, TX (US)

(73) Assignee: Chevron U.S.A. Inc., San Ramon, CA (US)

( * ) Notice: Subject to any disclaimer, the term of this patent is extended or adjusted under 35 U.S.C. 154(b) by 948 days.

(21) Appl. No.: 17/463,260

(22) Filed: Aug. 31, 2021

(65) Prior Publication Data
US 2023/0069445 A1    Mar. 2, 2023

(51) Int. Cl.
*G06F 30/28* (2020.01)
*E21B 47/26* (2012.01)
*E21B 49/08* (2006.01)
*G06F 30/3308* (2020.01)

(52) U.S. Cl.
CPC .......... *E21B 49/0875* (2020.05); *E21B 47/26* (2020.05); *G06F 30/28* (2020.01); *G06F 30/3308* (2020.01); *E21B 2200/20* (2020.05)

(58) Field of Classification Search
CPC .. G06F 30/28; G06F 30/3308; E21B 49/0875; E21B 47/26; E21B 49/087
See application file for complete search history.

(56) References Cited

FOREIGN PATENT DOCUMENTS

CN    113348458 A  *  9/2021  ............. E21B 43/00
CN    113685174 B  *  9/2023

OTHER PUBLICATIONS

Batool Haider, "Impact of Capillary Pressure and Critical Properties Shift . . ." (2015) [retrieved on Sep. 16, 2024] Retrieved from the internet: <URL: chromeextension://efaidnbmnnnibpcajpcglclefindmkaj/https://pangea.stanford.edu/ERE/pdf/pereports/MS/Haider2015.pdf? (Year: 2015).*

Alharthy et al. "Multiphase Compositional Modeling in Small-Scale Pores . . ." (2013) [retrieved on Sep. 16, 2024] Retrieved from the internet: <URL: https://www.researchgate.net/publication/267459203_Multiphase_Compositional_Modeling_in_Small-Scale_Pores_of_Unconventional_Shale_Reservoirs (Year: 2013).*

Amin Taghavinejad et al., Flow modeling in shale gas reservoirs: A comprehensive review (2020) [retrieved on Sep. 16, 2020] Retrieved from the internet: < URL: https://www.sciencedirect.com/science/article/pii/S1875510020303899 (Year: 2020).*

Du, F.; Huang, J.; Chai, Z.; Killough, J. "Effect of vertical heterogeneity and nano-confinement on the recovery performance of oil-rich shale reservoir" Fuel 267, 117199, 2020.

(Continued)

*Primary Examiner* — Rehana Perveen
*Assistant Examiner* — John David Hagler
(74) *Attorney, Agent, or Firm* — Esplin & Associates, PC

(57) ABSTRACT

An equation state with a mixing rule that captures a multi-component layering within nanopores may be used to model (1) fluid mixture in the nanopores of the reservoir and (2) movement of fluid between the nanopores and large pores of the reservoir. Such modeling of fluid behavior in large pores and nanopores of the reservoir may enable more accurate simulation of the reservoir (e.g., for hydrocarbon recovery).

20 Claims, 7 Drawing Sheets

(56) References Cited

OTHER PUBLICATIONS

Leonardo Travallonia, Marcelo Castier, Frederico W. Tavares. "Phase equilibrium of fluids confined in porous media froman extended Peng-Robinson equation of state";Fluid Phase Equilibria, vol. 362, 2014, p. 335-341.

Luo, S.; Lutkenhaus, J. L.; Nasrabadi, H. "A Framework for Incorporating Nanopores in Compositional Simulation to Model the Unusually High GOR Observed in Shale Reservoirs" SPE-193884-MS. SPE Reservoir Simulation Conference held in Galveston, Texas, USA, Apr. 10-11, 2019.

Sheng Luo, Bikai Jin, Jodie L. Lutkenhaus, Hadi Nasrabadi, "A novel pore-size-dependent equation of state for modeling fluid phase behavior in nanopores"; Fluid Phase Equilibria, vol. 498, 2019, p. 72-85.

* cited by examiner

FLUID MODELING WITH NANO-SCALE PORE SIZE EFFECTS FOR A RESERVOIR

FIELD

The present disclosure relates generally to the field of modeling fluid behavior in a reservoir using a mixing rule that captures a multi-component layering.

BACKGROUND

Nano-scale pore size effects in a reservoir may have a significant impact on states of the reservoir. For example, nano-scale pore size effects in a reservoir may have a significant impact on the original hydrocarbon in-place and depletion performance of the reservoir. Without appropriate representation of pressure, volume, and temperature dependencies for fluid properties that incorporates the nano-scale pore size effects, simulations of the reservoir may be inaccurate. For example, simulation of a reservoir that does not properly account for the nano-scale pore size effects may significantly underestimate oil recovery factors for oil systems or overestimate liquid production for condensate systems (e.g., by 10% to 30%).

SUMMARY

This disclosure relates to modeling fluid behavior in a reservoir. Reservoir characteristic information and/or other information may be obtained. The reservoir characteristic information may define characteristics of a reservoir. An initial condition of the reservoir may be determined based on the reservoir characteristic information and/or other information. The initial condition of the reservoir may include initial condition of fluid inside large pores and nanopores of the reservoir. Fluid movement between the large pores and the nanopores of the reservoir may be modeled using an equation of state to simulate changes from the initial condition of the reservoir. A mixing rule for the equation of state may capture a multi-component layering to model fluid mixture in the nanopores of the reservoir. Simulation of fluid extraction from the reservoir based on the fluid movement between the large pores and the nanopores of the reservoir may be facilitated.

A system for modeling fluid behavior in a reservoir may include one or more electronic storage, one or more processors and/or other components. The electronic storage may store reservoir characteristic information, information relating to a reservoir, information relating to characteristics of the reservoir, information relating to large pores and nanopores of the reservoir, information relating to an initial condition of the reservoir, information relating to fluid inside large pores and nanopores of the reservoir, information relating to fluid movement between larges pores and nanopores of the reservoir, information relating to an equation of state, information relating to a mixing rule, information relating to simulation of fluid extraction from the reservoir, and/or other information.

The processor(s) may be configured by machine-readable instructions. Executing the machine-readable instructions may cause the processor(s) to facilitate modeling fluid behavior in a reservoir. The machine-readable instructions may include one or more computer program components. The computer program components may include one or more of a reservoir component, an initial condition component, a fluid movement component, a simulation component, and/or other computer program components.

The reservoir component may be configured to obtain reservoir characteristic information and/or other information. The reservoir characteristic information may define characteristics of a reservoir.

The initial condition component may be configured to determine an initial condition of the reservoir based on the reservoir characteristic information and/or other information. The initial condition of the reservoir may include initial condition of fluid inside large pores and nanopores of the reservoir. In some implementations, the initial condition of the reservoir may be determined further based on equilibrium calculation using an equation of state.

The fluid movement component may be configured to model fluid movement between the large pores and the nanopores of the reservoir. The fluid movement between the large pores and the nanopores of the reservoir may be modeled using an equation of state to simulate changes from the initial condition of the reservoir. A mixing rule for the equation of state may capture a multi-component layering to model fluid mixture in the nanopores of the reservoir.

In some implementations, the equation of state may be a pore-size dependent equation of state. In some implementations, a given nanopore of the reservoir may include a core region and a surface adsorbed region. The multi-component layering captured by the mixing rule may include multiple layers within the surface adsorbed region to model fluid mixture between the multiple layers within the surface adsorbed region.

In some implementations, the modeling of the fluid movement between the large pores and the nanopores of the reservoir may include modeling movement of fluid from the nanopores to the large pores. In some implementations, the modeling of the fluid movement between the large pores and the nanopores further may include modeling the movement of fluid from the large pores to the nanopores.

In some implementations, different types of fluid molecules may be assigned different relative densities based on the mixing rule for the equation of state and/or other information. In some implementations, values of the different relative densities assigned to the different types of fluid molecules may be determined based on excess energy of the fluid molecules and/or other information.

In some implementations, surface-adsorbed fraction functions of fluid molecules may be determined based on the mixing rule for the equation of state and/or other information.

The simulation component may be configured to facilitate simulation of fluid extraction from the reservoir based on the fluid movement between the large pores and the nanopores of the reservoir and/or other information. In some implementations, the simulation of fluid extraction from the reservoir may include simulation of fluid extraction from the large pores of the reservoir.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form

DETAILED DESCRIPTION

The present disclosure relates to modeling fluid behavior in a reservoir. An equation state with a mixing rule that captures a multi-component layering within nanopores may be used to model (1) fluid mixture in the nanopores of the reservoir and (2) movement of fluid between the nanopores and large pores of the reservoir. Such modeling of fluid behavior in large pores and nanopores of the reservoir may enable more accurate simulation of the reservoir (e.g., for hydrocarbon recovery).

Figure 1:
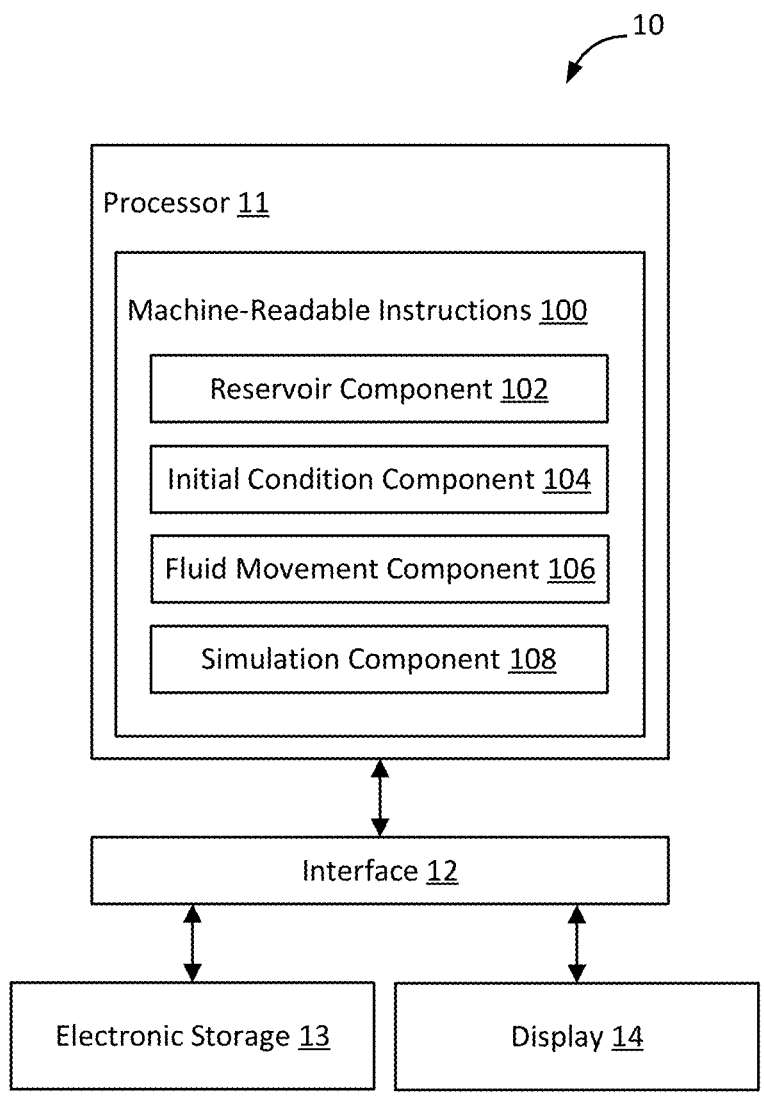
FIG. 1 illustrates an example system for modeling fluid behavior in a reservoir.

The methods and systems of the present disclosure may be implemented by a system and/or in a system, such as a system 10 shown in FIG. 1. The system 10 may include one or more of a processor 11, an interface 12 (e.g., bus, wireless interface), an electronic storage 13, a display 14, and/or other components. Reservoir characteristic information and/or other information may be obtained by the processor 11. The reservoir characteristic information may define characteristics of a reservoir. An initial condition of the reservoir may be determined by the processor 11 based on the reservoir characteristic information and/or other information. The initial condition of the reservoir may include initial condition of fluid inside large pores and nanopores of the reservoir. Fluid movement between the large pores and the nanopores of the reservoir may be modeled by the processor 11 using an equation of state to simulate changes from the initial condition of the reservoir. A mixing rule for the equation of state may capture a multi-component layering to model fluid mixture in the nanopores of the reservoir. Simulation of fluid extraction from the reservoir based on the fluid movement between the large pores and the nanopores of the reservoir may be facilitated by the processor 11.

The electronic storage 13 may be configured to include electronic storage medium that electronically stores information. The electronic storage 13 may store software algorithms, information determined by the processor 11, information received remotely, and/or other information that enables the system 10 to function properly. For example, the electronic storage 13 may store reservoir characteristic information, information relating to a reservoir, information relating to characteristics of the reservoir, information relating to large pores and nanopores of the reservoir, information relating to an initial condition of the reservoir, information relating to fluid inside large pores and nanopores of the reservoir, information relating to fluid movement between larges pores and nanopores of the reservoir, information relating to an equation of state, information relating to a mixing rule, information relating to simulation of fluid extraction from the reservoir, and/or other information.

The display 14 may refer to an electronic device that provides visual presentation of information. The display 14 may include a color display and/or a non-color display. The display 14 may be configured to visually present information. The display 14 may present information using/within one or more graphical user interfaces. For example, the display 14 may present information relating to the reservoir, information relating to characteristics of the reservoir, information relating to large pores and nanopores of the reservoir, information relating to an initial condition of the reservoir, information relating to fluid inside large pores and nanopores of the reservoir, information relating to fluid movement between larges pores and nanopores of the reservoir, information relating to an equation of state, information relating to a mixing rule, information relating to simulation of fluid extraction from the reservoir, and/or other information. For instance, the display 14 may present simulation results of fluid extraction from the reservoir.

Nano-scale pore size effects on fluid properties within the reservoir may have significant impact on behavior of fluid inside the reservoir. Inaccurate understanding and/or representations/modeling of nano-scale pore size effects may result in inaccurate prediction of reservoir conditions and/or performance. For example, hydrocarbons in the reservoir may be extracted from large pores (e.g., pores larger than 30 nm) in the reservoir. Hydrocarbons in nanopores may need to first travel from the nanopores (e.g., pores smaller than 30 nm) to the large pores before they can be extracted. Accurate phase-behavior level description of how fluid flows within the nanopores of the reservoir is needed to accurately model movement of fluid between the nanopores and the large pores of the reservoir. Failures to include such phase-behavior level description within a reservoir simulation may lead to inaccurate simulation results.

An equation of state may refer to a thermodynamic equation relating state variables which describe the state of matter under a given set of physical conditions, such as pressure, volume, temperature (PVT), and/or internal energy. Equations of state may be used to describe the properties of fluid and mixtures of fluid, such as fluid inside a reservoir (e.g., inside pores and fractures). Equations of state may provide the state of fluid molecules by density, by mixing component, by energy, and/or other factors.

A pore-size dependent equation of state may enable calculation of fluid phase behavior in nanopores in a consistent manner and may be used to model various PVT (pressure, volume, temperature) processes. Fluid PVT in nanopores may be different from bulk-scale PVT (in larges pores/fractures) in reservoirs. A pore-size dependent equation of state has been developed to describe fluid in two parts: multiple surface-adsorbed layers and a non-layered bulk-behavior core. However, the formulation of the pore-size dependent equation of state has been limited to single component and is not application for multi-component systems, which behave as "mixed-layerings." A mixing rule that captures the multi-component layering is needed to accurately model the fluid mixture's phase behavior in nanopores.

The current disclosure provides a mixing rule that captures the multi-component layering for a pore-size dependent equation of state and accurately describes the mixed surface layering phase behavior. Use of the mixing rule provided herein enables accurate modeling of fluid mixtures in the nanopores of the reservoir, which may be used to perform more accurate simulation of the reservoir than without the mixing rule. The mixing rule may improve the accuracy of the equation of state in performing analysis of the reservoir, such as reservoir simulation for shale and tight reservoir, fluid phase behavior calculation for hydrocarbon-in-place, primary production prediction, enhanced hydrocarbon recovery assessment, production history matching and prediction, and production optimization.

Hydrocarbon fluids in a reservoir may be classified into two groups: (1) bulk fluid in larges pores/fractures, and (2) confined fluid in nanopores. Nanopores may refer to pores that have size in nanoscale, while large pores may refer to pores that are larger than nanopores. In some implementations, a size range of nanopores may be between 2 nm and 30 nm, and a size range of large pores be between 30 nm and tens to hundreds of micrometers (1 micrometer=1000 nm). For example, the separation between the large pores and nanopores may be defined in terms of nanometers. For instance, the cutoff for nanopores may be set at/around 30 nm: pores greater than 30 nm may be considered as large pores and pores equal to or smaller than 30 nm may be considered as nanopores. Use of other size ranges and cutoff/separation for different types of pores are contemplated.

Figure 3:
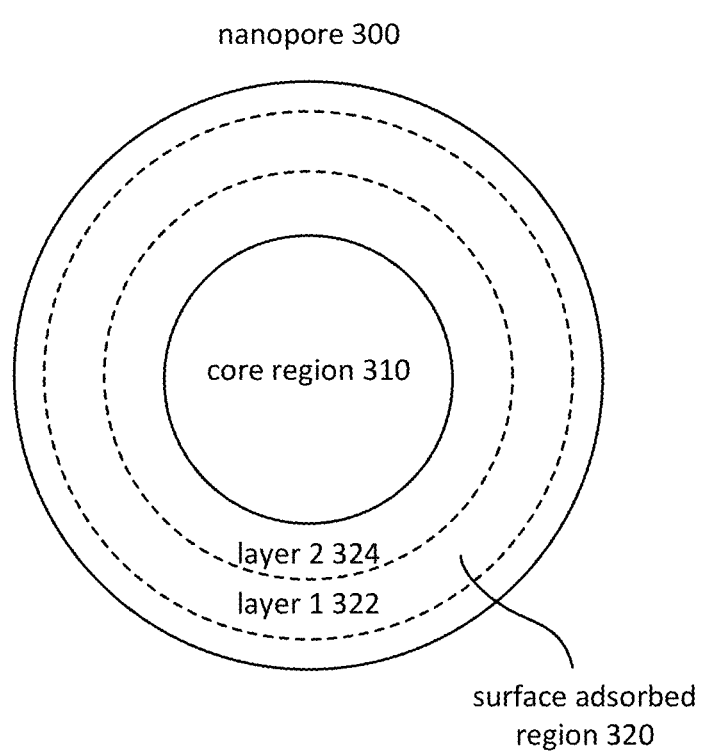
FIG. 3 illustrates an example nanopore with different regions.

A nanopore may include different regions. FIG. 3 illustrates an example nanopore 300 with different regions. The nanopore 300 may have a core region 310 in which fluid have bulk-like behavior, and a surface adsorbed region 320 in which fluid behavior is impacted by physical interactions of fluid molecules with the surface of the nanopore 300. The multi-component layering captured by the mixing rule of the current disclosure includes multiple layers within the surface adsorbed region 320 to model fluid mixture between the multiple layers within the surface adsorbed region 320. For instance, as shown in FIG. 3, the subsurface adsorbed region may be separated into two layers: layer 1 322 and layer 2 324. The mixing rule of the current disclosure may accurately model fluid phase behavior in the nanopore 300 via accurate representation/calculation of fluid mixture between the layers 322, 324. The mixing rule of the present disclosure may accurately represent movement of fluid in and out of large pores and nanopores. The mixing rule of the present disclosure may accurately represent mixture of fluid within the layers 322, 324. That is, the mixing rule of the present disclosure may provide how molecules in layer 1 322 will mix with molecules in layer 2 324, and vice versa. The mixing rule of the present disclosure may be used to determine different fluid distributions within the layers 322, 324.

Fluid may mix between the layers 322, 324, and the fluid mixing may be controlled via physical interactions and molecule size effects. Fluid physics in the nanopore 300 may include attraction of fluid molecules to the surface of the nanopore 300 (surface attraction). Surface attraction may have greater impact on larger/heavier molecules because of stronger interaction of such molecules with the pore surface than smaller/lighter molecules. Presence of fluid inside the nanopore 300 may also be impacted by density/pressure. For example, at high density, larger/heavier molecules may tend to be pushed out of the nanopore 300. That is, larger/heavier molecules may be pushed out because there is less space inside the nanopore 300.

The mixing rule of the current disclosure may be used to improve the accuracy of equation of state. An example pore-size dependent equation of state is described in "A novel pore-size-dependent equation of state for modeling fluid phase behavior in nanopores," Sheng Luo, Bikai Jin, Jodie L. Lutkenhaus, Hadi Nasrabadi. Fluid Phase Equilibria, Vol 498, 2019, Page 72-85 ("Luo"), which is incorporated by reference in its entirety. The mixing rule of the current disclosure may be used to improve the accuracy of the pore-size dependent equation of state described in Luo. Use/improvement of other equation of state/pore-size dependent equation of state is contemplated.

In Luo, the mixing rule did not consider mixing between multiple layers of the surface adsorbed region (how different layers of molecules in the surface adsorbed region mixed with each other). Rather, a relative pore fluid density (θ) is defined on total fluid, and all fluid species is described with the same pore fluid density. Rather than accurately describing interaction of molecules between different layers, Luo treated all molecules as experiencing the same fluid density and used average density for the fluid. Using the same density value for all molecules is treating all molecules as experiencing the same density the same way. However, such treatment of molecules is inaccurate as differently sized/weighed molecules experience the environment differently (e.g., have different surface interaction with the nanopore).

The mixing rule of the current disclosure allows for different densities to be determined (e.g., calculated, specified) for molecules of different types (e.g., molecules of different size/weight). Rather than using an average density for all molecules, average density may be determined for each type of molecule. Use of different densities for different molecule types allows for more accurate representation of fluid properties within the nanopores. Different densities for different molecule types may be determined based on different excess energy for the different molecule types. Excess energy for the molecules may refer to additional energy for the molecules due to surface interaction with the nanopore. Molecules that are larger/heavier may have greater excess energy than molecules that are smaller/lighter because of greater surface interaction between the nanopore surface and the larger/heavier molecules than the smaller/lighter molecules.

For the mixing rule, a specific density ($\theta_i$) for component i of fluid (particular molecule type in fluid) is introduced by considering the excess energy ($\varepsilon_{ex,i}$) due to the surface interaction. The excess energy is calculated by removing the fluid energy (and thereby taking away fluid interaction) as shown in equation (1). ($\varepsilon_{sf,i}$) represents surface energy, ($\varepsilon_{ff,i}$) represents fluid energy, and ($h_{sf}$) represents coordination number coefficient for surface-adsorbed fluid. The surface energy is adjusted via a factor of 0.625 to account for molecules on the surface—that is, surface energy is reduced because molecules on the surface reduces the extent of surface interaction. The factor of 0.625 is derived as half of dual-square-well potential for fluid-pore wall interaction to account for two-side interaction.

$$\varepsilon_{ex,i}=0.625\varepsilon_{sf,i}-\varepsilon_{ff,i}\cdot(1-h_{sf}) \tag{1}$$

Two parameters for the equation of state are calculated using equations (2) and (3). Equation (2) gives the energy parameter ($\alpha_i$) for the equation of state, and equation (3) gives the relative pore fluid density of component i ($\theta_i$) for the equation of state. ($\alpha_i$) provides the weighted excess energy. Equation (2) turns excess energy into dimensionless weight via normalization. ($n_{mix}$) is a tunable parameter that controls how strongly the excess energy impacts the normalized weight and provides user-controlled tuning of density. (x) represents molar fraction.

$$\alpha_i = \frac{\varepsilon_{ex,i}^{n_{mix}}}{\sum_{j=1}^{NC} x_j \varepsilon_{ex,j}^{n_{mix}}} \tag{2}$$

$$\theta_i = \alpha_i \theta + 1 - \alpha_i \tag{3}$$

The surface-adsorbed fraction functions ($F_{p1,i}, F_{p2,i}$) are modified by introducing the following molecule-mixing effect: at low fluid density, the large molecules are preferably adsorbed on the pore surface due to the higher interaction energy; at high fluid density, large molecules preferably stay in the center bulk region rather than in surface layers due to the size effect. ($F_{p1}$) represents fraction of fluid molecules in the first adsorbed layer on the pore wall (layer 1 322 in FIG. 3, and ($F_{p2}$) represents fraction of fluid molecules in the first and second adsorbed layers on the pore wall (layer 1 322 and layer 2 324 in FIG. 3).

The mixing rule includes the molecule size effect in mixtures in formulating the distribution fraction functions ($F_{p1,i}, F_{p2,i}$). The random-distributed fraction functions ($\bar{F}_{pr1,i}, \bar{F}_{pr2,i}$) are adjusted with the molecule-size effect in mixtures, as shown in equations (4) and (5). ($\bar{F}_{pr1}$) represents fraction of fluid molecules in the first adsorbed layer on the pore wall under random distribution, and ($\bar{F}_{pr2}$) represents fraction of fluid molecules in the first and second adsorbed layers on the pore wall under random distribution. ($m_{mix}$) and ($V_{mix}$) are tunable mixing parameters to denoting the relative strength of molecular packing and volumetric mixing in layers. ($b_p$) represents volume parameter of molecule in the equation of state. ($\bar{F}_{pr1,i}$) and ($\bar{F}_{pr2,k}$) represents original random distributions without mixing, and ($\hat{F}_{pr1,i}$) and ($\hat{F}_{pr2,i}$) represents random distribution with mixing. The random distributions with mixing in equations (4) and (5) take into account molecules experiencing different random space volume.

$$\hat{F}_{pr1,i} = \frac{b_{p,i}^{-m_{mix}}}{\sum_{j=1}^{NC} x_j b_{p,j}^{-m_{mix}}} \cdot \sum_{k=1}^{NC} \frac{x_k b_{p,k}^{V_{mix}}}{\sum_{j=1}^{NC} x_j b_{p,j}^{V_{mix}}} \cdot \bar{F}_{pr1,k} \quad (4)$$

$$\hat{F}_{pr2,i} = \frac{b_{p,i}^{-m_{mix}}}{\sum_{j=1}^{NC} x_j b_{p,j}^{-m_{mix}}} \cdot \sum_{k=1}^{NC} \frac{x_k b_{p,k}^{V_{mix}}}{\sum_{j=1}^{NC} x_j b_{p,j}^{V_{mix}}} \cdot \bar{F}_{pr2,k} \quad (5)$$

A modified density ($\rho'$) represents fluid density and is determined using equation (6). ($s_4$) and ($s_5$) are parameters in fraction functions for surface-adsorbed fluid. ($r^*_{p,mix}$) is the dimensionless mixing pore size parameter, ($\gamma$) is the exponent of the Gaussian-like part in fraction functions for surface-adsorbed fluid, and ($\gamma_{mix}$) is the mixture density transition sharpness factor. ($\gamma$) defines the original shape of ($F_p$), and ($\gamma_{mix}$) is used to modify this shape. Equation (6) determines the modified density ($\rho'$) by changing the original total system density ($\theta$) based on shift of distribution shape.

$$\rho' = \exp(-s_4 (r^*_{p,mix} - 0.5)^{-s_5} \cdot (\theta - 1)^{\gamma \gamma_{mix}}) \quad (6)$$

The surface-adsorbed fraction functions in surface layers ($F_{p1,i}, F_{p2,i}$) are derived with the effective random-distributed fractions ($F_{pr1,eff,i}, F_{pr2,eff,i}$) using equations (7)-(10). ($\beta$) represents parameters in fraction functions for subsurface-adsorbed layers.

Equations (7)-(10) utilize the modified density ($\rho'$) in the computation to incorporate the mixing effect. Equations (7) and (8) adjust the original fraction of fluid molecules for random distribution using the modified density ($\rho'$) as weighting factors. Equations (9) and (10) adjust the original fraction of fluid using the results of equations (7) and (8) and using the modified density ($\rho'$) as weighting term. With equations (9) and (1), fractions of fluid molecules are computed to consider the mixing of fluid molecules between layers of the surface adsorbed region.

$$F_{pr1,eff,i} = \rho' \cdot \hat{F}_{pr1,i} + (1-\rho') F_{pr1,i} \quad (7)$$

$$F_{pr2,eff,i} = \rho' \cdot \hat{F}_{pr2,i} + (1-\rho') F_{pr2,i} \quad (8)$$

$$F_{p1,i} = \quad (9)$$
$$F_{pr1,eff,i} + (1-\rho')(1-F_{pr1,i})\left(1-\exp\left(-\frac{\beta_{0,i}}{T}\right)\right)(1-\exp(-\beta_1(\theta_i-1)^\gamma))$$

$$F_{p2,i} = \quad (10)$$
$$F_{pr2,eff,i} + (1-\rho')(1-F_{pr2,i})\left(1-\exp\left(-\frac{\beta_{0,i}}{T}\right)\right)(1-\exp(-\beta_2(\theta_i-1)^\gamma))$$

Figure 4A:
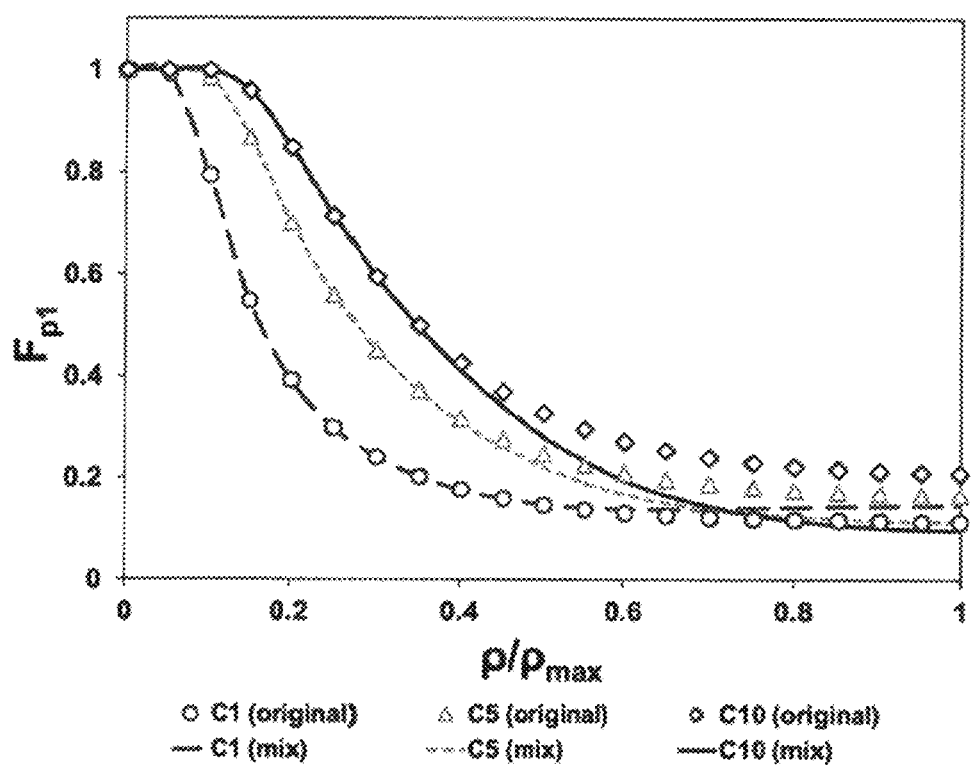
FIGS. 4A and 4B illustrate changes in molecule fraction in nanopore layers using a mixing rule.
Figure 4B:
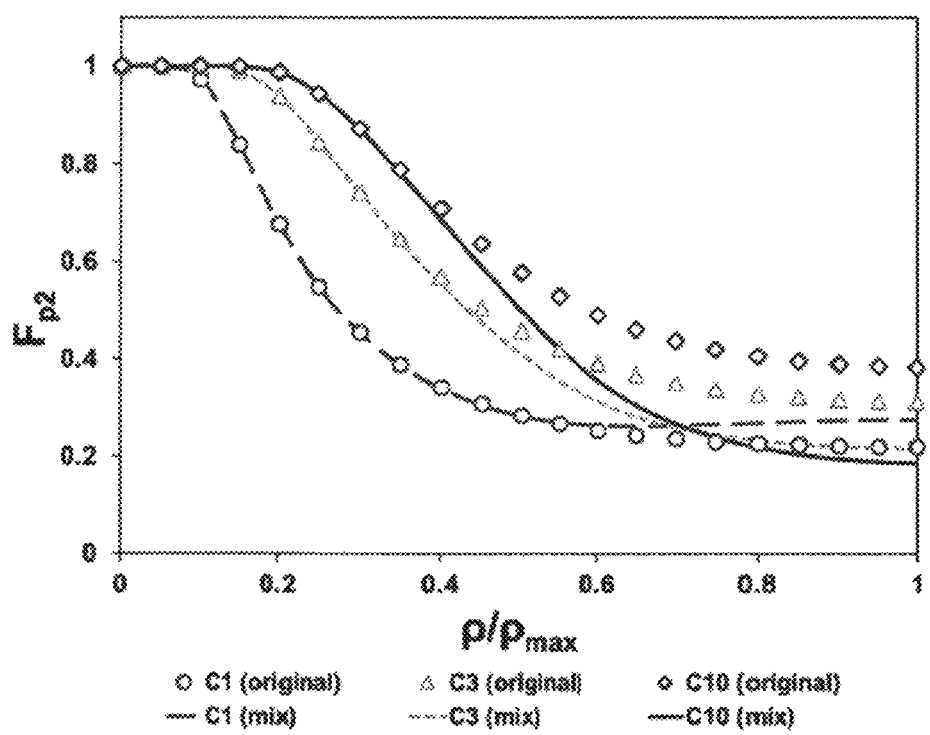

FIGS. 4A and 4B show example differences in fraction functions for different types of molecules in fluid when mixing of molecules is and is not considered. Y-axis is the fraction of molecules by count, and the x-axis is a dimensionless density value. Original values correspond to fraction function without mixing taken into account, while mix values correspond to fraction function with mixing taken into account. At low density, fraction functions with and without mixing are similar. Fraction functions with and without mixing deviates as density increases.

After formulating the mixing effect on fluid distribution fraction functions, the volume of bulk region ($V_{co,eos}$) (e.g., the core region 310 in FIG. 3) and surface adsorbed region ($V_{sf,eos}$) (e.g., the surface adsorbed region 320 in FIG. 3) may be determined. Moles of fluid molecule components in the surface adsorbed region ($n'_{sf,i}$) that incorporates mixing of molecules is computed using equation (11). Equation (11) utilizes both the original average density and the mixing effect to modify the original number of the fluid molecule component ($n_i$). The volume change on the surface of the nanopore is determined in equations (12)-(17) by using the difference between the molecule count without and with the mixing effect. Volume change due to mixing includes both a shrinking component and an addition component. Equations (16) and (17) provide volume of the bulk region and the surface adsorbed region with the mixing effect.

$$n'_{sf,i} = n_i \cdot \quad (11)$$
$$\left(F_{pr2,eff,i} + (1-\rho')(1-F_{pr2,i})\left(1-\exp\left(-\frac{\beta_{0,i}}{T}\right)\right)(1-\exp(-\beta_2(\theta-1)^\gamma))\right)$$

$$V_{add} = \sum_{i=1}^{NC} (n_{sf,i} - n'_{sf,i}) b_{p,i} \quad (12)$$

$$V_{vd} = V_{eos} \cdot \sum_{i=1}^{NC} F_{pr2,i} \frac{x_i b_{p,i}^{V_{mix}}}{\sum_{j=1}^{NC} x_j b_{p,j}^{V_{mix}}} - \sum_{i=1}^{NC} n'_{sf,i} b_{p,i} \quad (13)$$

$$V_{sk} = \frac{V_{vd} V_{add}}{V_{vd} + V_{add}} \quad (14)$$

$$\bar{F}_{pr2,eff} = \sum_{i=1}^{NC} F_{pr2,i} \frac{x_i b_{p,i}^{V_{mix}}}{\sum_{j=1}^{NC} x_j b_{p,j}^{V_{mix}}} + \frac{V_{add}}{V_{eos}} - \frac{V_{sk}}{V_{eos}} \quad (15)$$

$$V_{co,eos} = V_{eos}(1 - \bar{F}_{pr2,eff}) \quad (16)$$

$$V_{sf,eos} = V_{eos} \bar{F}_{pr2,eff} \quad (17)$$

The above formulations with the mixing effect may be used to calculate parameters for an equation of state. For example, the above formulations may be used in the following expressions for generalized van der Waals canonical partition function (Q) and the Helmholtz free energy (A) (from Luo) to incorporate the mixing effect:

$$Q(T, V, N_1, N_2, \ldots, N_{NC}) = \prod_{i=1}^{NC} \left( \frac{q_i^{N_i}}{\lambda_i^{3N_i} N_i!} \right) V_f^N \exp\left( \int_{\infty}^{T} \frac{E_{conf}}{k_B T^2} dT \right)$$

$$A(T, V, N_1, N_2, \ldots, N_{NC}) = -kT \ln Q(T, V, N_1, N_2, \ldots, N_{NC})$$

The Helmholtz free energy expression with the mixing effect may provide the description of energy in the nanopore, and the expression may be minimized to obtain phase equilibrium (most stable state achieve with minimum energy). The state of fluid at phase equilibrium may be used to more accurately model fluid behavior for the nanopores.

For example, the equation of state improved with the mixing rule described herein may be used to determine the original reservoir state (e.g., the amount of hydrocarbon in place, the number of molecules in pores at given pressure and temperature). With the original reservoir state, the equation of state improved with the mixing rule may be used to model depletion in the reservoir (which includes change in temperature and pressure), the equilibrium may be calculated to determine the hydrocarbon/molecule amount in the nanopores at different depleted pressure stages.

Referring back to FIG. 1, the processor 11 may be configured to provide information processing capabilities in the system 10. As such, the processor 11 may comprise one or more of a digital processor, an analog processor, a digital circuit designed to process information, a central processing unit, a graphics processing unit, a microcontroller, an analog circuit designed to process information, a state machine, and/or other mechanisms for electronically processing information. The processor 11 may be configured to execute one or more machine-readable instructions 100 to facilitate modeling fluid behavior in a reservoir. The machine-readable instructions 100 may include one or more computer program components. The machine-readable instructions 100 may include a reservoir component 102, an initial condition component 104, a fluid movement component 106, a simulation component 108, and/or other computer program components.

The reservoir component 102 may be configured to obtain reservoir characteristic information and/or other information. Obtaining reservoir characteristic information may include one or more of accessing, acquiring, analyzing, determining, examining, identifying, loading, locating, opening, receiving, retrieving, reviewing, selecting, storing, and/or otherwise obtaining the reservoir characteristic information. The reservoir component 102 may obtain reservoir characteristic information from one or more locations. For example, the reservoir component 102 may obtain reservoir characteristic information from a storage location, such as the electronic storage 13, electronic storage of a device accessible via a network, and/or other locations. The reservoir component 102 may obtain reservoir characteristic information from one or more hardware components (e.g., a computing device) and/or one or more software components (e.g., software running on a computing device). In some implementations, the reservoir characteristic information may be obtained from one or more users. For example, a user may interact with a computing device to input the reservoir characteristic information (e.g., identify which reservoir characteristics will be used, enter values of reservoir characteristics).

The reservoir characteristic information may define characteristics of a reservoir. A reservoir may refer to a location at which one or more resources are stored. For example, a reservoir may refer to a location at which hydrocarbon are stored. For instance, a reservoir may refer to a location including rocks in which oil and/or natural gas have accumulated. A reservoir may include regions above the surface, at the surface, and/or below the surface. For example, a reservoir may include one or more subsurface regions. A subsurface region may refer to a part of earth located beneath the surface/located underground. A subsurface region may refer to a part of earth that is not exposed at the surface of the ground. A reservoir may include one or more wells. For example, a reservoir may include one or more injection wells (e.g., for injection of fluid), one or more production wells (e.g., for extraction of oil or gas), and/or other wells. A reservoir may refer to a location in which buoyant forces keep hydrocarbons in place below a sealing caprock. A reservoir may refer to a location in which oil or natural gas readily flows into wellbore, such as a conventional reservoir. A reservoir may refer to a location in which fractures (e.g., hydraulic fractures) may be required to extract the stored resources, such as an unconventional reservoir (e.g., tight-gas sands, gas and oil shales).

Characteristics of a reservoir may refer to attribute, quality, configuration, parameter, and/or characteristics of matter within the reservoir (e.g., above the surface, at the surface, below the surface). Characteristics of the reservoir may refer to environmental characteristics, such as physical arrangement, composition, properties, and/or characteristics of materials (e.g., subsurface elements) within the reservoir. Characteristics of the reservoir may refer to design characteristics, such as information relating to design of one or more wells (e.g., well spacing, well location) within the reservoir. Characteristics of the reservoir may refer operational characteristics, such as to information relating to operation of one or more wells in the reservoir (e.g., operating characteristics of well(s) in the reservoir). Other characteristics of the reservoir are contemplated.

In some implementations, the characteristics of the reservoir may be obtained from sampling and/or measurements at the reservoir. For example, the characteristics of the reservoir may be obtained from production fluid sampling and/or bulk fluid PVT measurements.

In some implementations, the characteristics of the reservoir may include petrophysical properties of the reservoir, the geo-mechanical properties of the reservoir, and/or other properties of the reservoir. For example, petrophysical properties of the reservoir may include permeability, porosity, saturation, reservoir pressure, and/or other petrophysical properties, and geo-mechanical properties of the reservoir may include Young's modulus, Poisson ratio, stress, fracture toughness, and/or other geo-mechanical properties.

In some implementations, the characteristics of the reservoir may include static characteristics, dynamic characteristics, and/or other characteristics of the reservoir. Static characteristics of the reservoir may refer to characteristics of the reservoir that may not change (e.g., with time). Dynamic characteristics of the reservoir may refer to characteristics of the reservoir that may change (e.g., with time)

The reservoir characteristic information may define characteristics of the reservoir by including information that describes, delineates, defines, identifies, is associated with, quantifies, reflects, sets forth, and/or otherwise defines one or more of value, property, quality, quantity, attribute, feature, and/or other aspects of the characteristics within the reservoir. The reservoir characteristic information may directly and/or indirectly define the characteristics of the reservoir. For example, the reservoir characteristic information may define characteristics of the reservoir by including information that identifies and/or specifies value of specific characteristics of the reservoir and/or information that may be used to determine the identity and/or the value of the specific characteristics of the reservoir. Other types of reservoir characteristic information are contemplated.

The initial condition component 104 may be configured to determine an initial condition of the reservoir based on the reservoir characteristic information and/or other information. Determining the initial condition of the reservoir may include ascertaining, approximating, calculating, establishing, estimating, finding, identifying, obtaining, quantifying, selecting, setting, and/or otherwise determining the initial condition of the reservoir. In some implementations, the initial condition of the reservoir may be determined with specific values (e.g., determine specific values of reservoir characteristics). In some implementations, the initial condition of the reservoir may be determined with ranges of values (e.g., determine ranges of values of reservoir characteristics).

In some implementations, the initial condition of the reservoir may be determined further based on equilibrium calculation using an equation of state. The equation of state may be improved using the mixing rule described herein (e.g., calculate parameters for the equation of state using the mixing rule). Equilibrium calculation using the equation of state improved with the mixing rule may result in more accurate determination of the initial condition of the reservoir than when using equation of state without the mixing rule of the current disclosure. By using the equation of state improved with the mixing rule that captures the multi-component layering to model fluid mixture in the nanopores of the reservoir, the equilibrium calculation may provide more accurate determination of the initial state of the reservoir.

The initial condition of the reservoir may refer to a state of the reservoir before changes in the reservoir are simulated. The initial condition of the reservoir may refer to a state of the reservoir for the beginning of a reservoir simulation. The initial condition of the reservoir may include initial condition of matter within the reservoir. The initial condition of the reservoir may include initial arrangement of matter within the reservoir, such as location and types of subsurface layers and boundaries within the reservoir. The initial condition of the reservoir may include initial number, types, and/or locations of subsurface structures within the reservoir. A subsurface structure may refer to aggregate of matter under the surface. A subsurface structure may refer to arrangement of matter to form a coherent form. For example, the initial condition of the reservoir may include initial number and/or locations of pores (e.g., large pores, nanopores) and fractures within the reservoir.

The initial condition of the reservoir may refer to initial condition of matter inside the reservoir. The initial condition of the reservoir may include initial condition of fluid inside subsurface structures (e.g., large pores, nanopores, fractures) within the reservoir. For example, the initial condition of the reservoir may include pore size distribution, original fluid state in pores, and original hydrocarbon in place of the reservoir.

The fluid movement component 106 may be configured to model fluid movement within the reservoir. The fluid movement may be modeled to simulate changes in fluid within the reservoir. The fluid movement within the reservoir may include movement of fluid (and matters carried within the fluid, such as hydrocarbons) between subsurface structures within the reservoir. For example, the fluid movement component may model fluid movement between different pores (e.g., between large pores and nanopores) and/or fractures of the reservoir. Modeling of the fluid movement within the reservoir may include act of creating a computer simulation of the fluid movement within the reservoir. Modeling of the fluid movement within the reservoir may be performed using one or more computing devices. Modeling of the fluid movement within the reservoir may include simulation of how fluid moves within the reservoir (e.g., between pores, between pores and fractures) due to static and/or dynamic conditions within the reservoir. For example, the Modeling of the fluid movement within the reservoir may include simulation of how fluid moves within the reservoir due to pressures and/or temperature (e.g., changes in pressure and/or temperature) within the reservoir.

The fluid movement between the subsurface structures within the reservoir (e.g., the large pores, the nanopores, fractures) of the reservoir may be modeled using an equation of state (e.g., a pore-size dependent equation of state) to simulate changes from the initial condition of the reservoir. That is the equation of state may be used to simulate how the reservoir changes from the initial condition determined by the initial condition component 104. And as described above, the mixing rule for the equation of state may capture a multi-component layering of the nanopores to model fluid mixture in the nanopores of the reservoir. The equation of state improved with the mixing rule may increase the performance (e.g., accuracy) of modeling hydrocarbon mixtures PVT and phase behavior in the nanopores of the reservoir.

Figure 5:
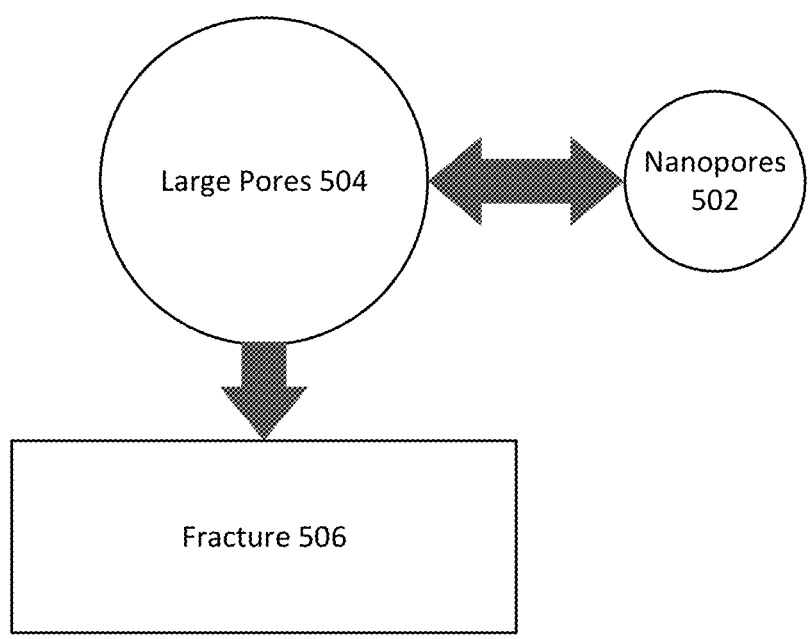
FIG. 5 illustrates example modeling of fluid movement within a reservoir.

In some implementations, the modeling of the fluid movement between the large pores and the nanopores of the reservoir may include modeling movement of fluid from the nanopores to the large pores. For example, as shown in FIG. 5, the fluid movement component 106 may model movement of fluid from nanopores 502 to large pores 504 (e.g., model nano-fluid depletion with pore-size dependent equation of state). In some implementations, the modeling of the fluid movement between the large pores and the nanopores further may include modeling the movement of fluid from the large pores to the nanopores. For example, as shown in FIG. 5, the fluid movement component 106 may model movement of fluid from the large pores 504 to the nanopores 502. In some implementations, the modeling of the fluid within the reservoir may include modeling movement of fluid from the pores to the fractures. For example, as shown in FIG. 5, the fluid movement component 106 may model movement of fluid from the large pores 504 to fractures 506. Fluid that travels from the pores into the fractures may carry hydrocarbons, and movement of fluid from the pores into the fractures may be required to extract hydrocarbons from the reservoir.

In some implementations, for the modeling of fluid movement within the reservoir/for reservoir simulation, different types of fluid molecules may be assigned different relative densities based on the mixing rule for the equation of state and/or other information. For example, as shown in equation (3), different types of fluid molecules may be assigned different relative densities (different θ values), rather than using an average density for different types of molecules inside the fluid.

In some implementations, for the modeling of fluid movement within the reservoir/for reservoir simulation, values of the different relative densities assigned to the different types of fluid molecules may be determined based on excess energy of the fluid molecules and/or other information. For example, as shown in equations (1)-(3), the excess energy of a fluid molecule type is turned into a dimensionless weight and used to determine the relative density value for the fluid molecule type.

In some implementations, for the modeling of fluid movement within the reservoir/for reservoir simulation, surface-adsorbed fraction functions of fluid molecules may be determined based on the mixing rule for the equation of state and/or other information. For example, as shown in equations (9) and (10), the mixing rule described herein allows for more accurate calculation of fractions of fluid molecules in surface-adsorbed layers.

The simulation component 108 may be configured to facilitate simulation of the reservoir. Simulation of the reservoir may include modeling of static and/or dynamic conditions within the reservoir. The simulation component 108 may facilitate use of the equation of state improved with the mixing rule described herein to perform reservoir simulation. The simulation component may facilitate use of the information determined from the equation of state improved with the mixing rule described herein to perform simulation of the reservoir. In some implementations, facilitating simulation of the reservoir may include (1) presenting the simulation on the display 14, (2) presenting information determined from the equation of state improved with the mixing rule on the display 14, (3) providing information determined from the equation of state improved with the mixing rule to one or more simulation processes, (4) providing the equation of state improved with the mixing rule to one or more simulation processes, (5) performing simulation of the reservoir using the equation of state improved with the mixing rule, (6) performing simulation of the reservoir using information determined from the equation of state improved with the mixing rule, and/or other facilitating of the reservoir simulation.

The reservoir simulation may be used to determine one or more characteristics of the reservoir. For example, the equation of state improved with the mixing rule may be used for fluid phase behavior computation for hydrocarbon in place, primary production prediction, enhanced oil recovery assessment for tight/shale assets, production history matching and prediction, and/or production improvement (e.g., production optimization).

For example, the simulation component 108 may be configured to facilitate simulation of fluid extraction from the reservoir based on the fluid movement between the large pores and the nanopores of the reservoir and/or other information. Large pore-nanopore fluid movement modeled by the fluid movement component 106 may be used to simulate fluid extraction from the reservoir. The simulation of fluid extraction from the reservoir may include simulation of fluid extraction from the large pores of the reservoir. That is, before fluid can be extracted from nanopores, the fluid may need to move into larges pores (then to fractures) within the reservoir. The simulation component 108 may facilitate more accurate simulation of fluid extraction from the reservoir by using modeling of fluid from the nanopores into the large pores. The simulation may model fluid differently based on whether the fluid is inside the nanopores or the large pores (by using the equation of state improved with the mixing rule), and by independently accounting for nanopore effects in the reservoir simulation, more accurate simulation results may be obtained. The equation of state improved with the mixing rule may be used to improve accuracy of parameters/parameter values used in the simulation (e.g., fluid simulation with desorption model).

For example, for a shale and tight formation, hydrocarbon fluids may exist as bulk fluid in large pores/fractures and as confined fluids in nanopores. Nanopore fluid PVT may be modeled using a pore-size dependent equation of state improved with the mixing rule described herein. The nano-PVT may be approximated as a multi-component adsorption/desorption model. The porosity space of the reservoir model may be divided into bulk space as the regular porosity and the nanopores in which the fluid is modeled by adsorption model. The multi-component adsorption model applied in reservoir simulation may enable dynamically accounting for the nanopore effect in the reservoir simulation.

Figure 6:
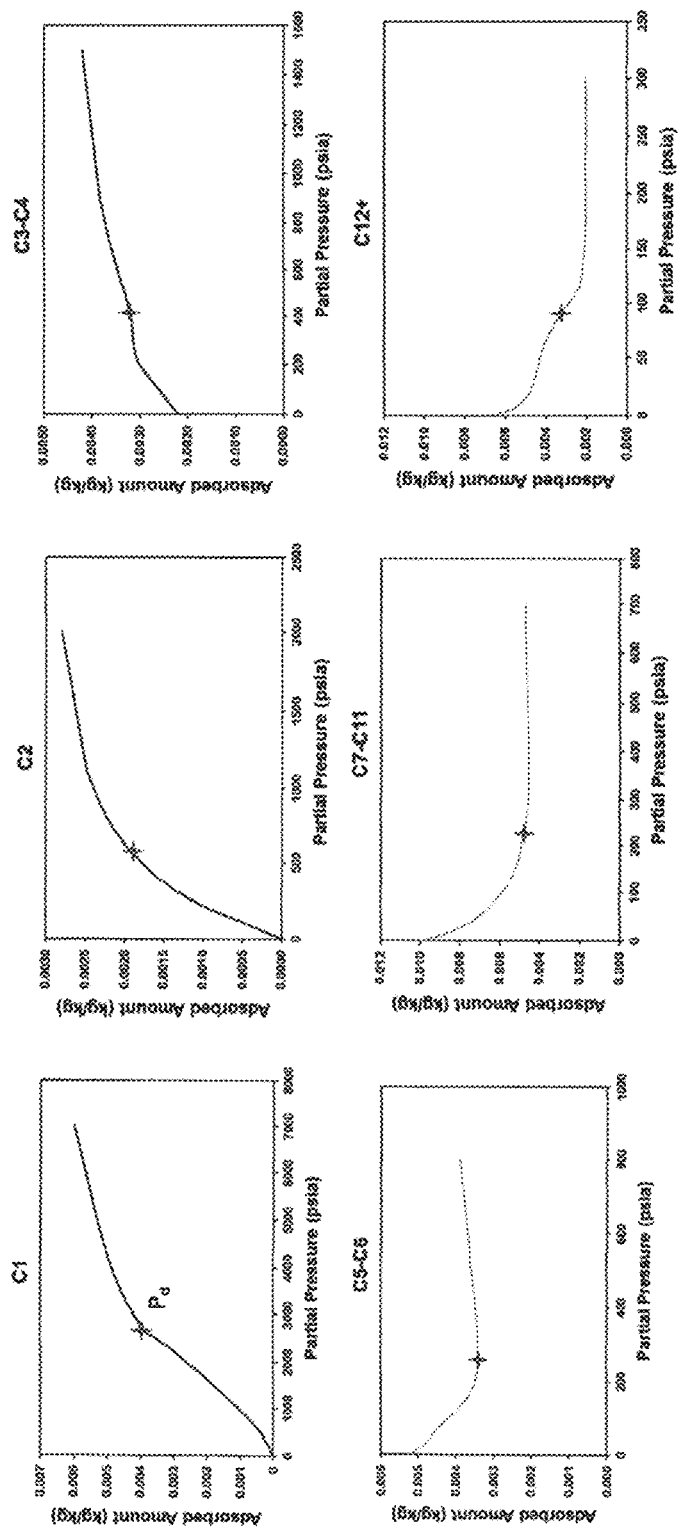
FIG. 6 illustrates example nano-PVT adsorption tables implement in reservoir simulation.

For instance, production fluid sampling and bulk fluid PVT measurement and characterization may be used with the equation of state (improved with the mixing rule) to assess original hydrocarbon in-place for pore size distribution. Nano-fluid depletion may be modeled, and equilibrium calculation may be performed using the equation of state to compute depletion behavior and determine the amount of hydrocarbon in nanopores at different pressures and/or temperatures. The nano-depletion results may be converted into a desorption model for use in fluid flow simulation. FIG. 6 illustrates example nano-PVT adsorption tables implemented in reservoir simulation. The curves of the nano-PVT adsorption tables may be generated from the nano-depletion results. The fluid amount in nanopores may be translated into adsorbed amount. Reservoir simulation with adsorption model may accurately capture hydrocarbon depletion from nanopores.

Implementations of the disclosure may be made in hardware, firmware, software, or any suitable combination thereof. Aspects of the disclosure may be implemented as instructions stored on a machine-readable medium, which may be read and executed by one or more processors. A machine-readable medium may include any mechanism for storing or transmitting information in a form readable by a machine (e.g., a computing device). A machine-readable medium may include non-transitory computer-readable medium. For example, a tangible computer-readable storage medium may include read-only memory, random access memory, magnetic disk storage media, optical storage media, flash memory devices, and others, and a machine-readable transmission media may include forms of propagated signals, such as carrier waves, infrared signals, digital signals, and others. Firmware, software, routines, or instructions may be described herein in terms of specific exemplary aspects and implementations of the disclosure, and performing certain actions.

In some implementations, some or all of the functionalities attributed herein to the system 10 may be provided by external resources not included in the system 10. External resources may include hosts/sources of information, computing, and/or processing and/or other providers of information, computing, and/or processing outside of the system 10.

Although the processor 11, the electronic storage 13, and the display 14 are shown to be connected to the interface 12 in FIG. 1, any communication medium may be used to facilitate interaction between any components of the system 10. One or more components of the system 10 may communicate with each other through hard-wired communication, wireless communication, or both. For example, one or more components of the system 10 may communicate with each other through a network. For example, the processor 11 may wirelessly communicate with the electronic storage 13. By way of non-limiting example, wireless communication may include one or more of radio communication, Bluetooth communication, Wi-Fi communication, cellular communication, infrared communication, or other wireless communication. Other types of communications are contemplated by the present disclosure.

Although the processor 11, the electronic storage 13, and the display 14 are shown in FIG. 1 as single entities, this is for illustrative purposes only. One or more of the components of the system 10 may be contained within a single device or across multiple devices. For instance, the processor 11 may comprise a plurality of processing units. These processing units may be physically located within the same device, or the processor 11 may represent processing functionality of a plurality of devices operating in coordination. The processor 11 may be separate from and/or be part of one or more components of the system 10. The processor 11 may be configured to execute one or more components by software; hardware; firmware; some combination of software, hardware, and/or firmware; and/or other mechanisms for configuring processing capabilities on the processor 11. The system 10 may be implemented in a single computing device, across multiple computing devices, in a client-server environment, in a cloud environment, and/or in other devices/configuration of devices. The system 10 may be implemented using a computer, a desktop, a laptop, a phone, a tablet, a mobile device, a server, and/or other computing devices.

It should be appreciated that although computer program components are illustrated in FIG. 1 as being co-located within a single processing unit, one or more of computer program components may be located remotely from the other computer program components. While computer program components are described as performing or being configured to perform operations, computer program components may comprise instructions which may program processor 11 and/or system 10 to perform the operation.

While computer program components are described herein as being implemented via processor 11 through machine-readable instructions 100, this is merely for ease of reference and is not meant to be limiting. In some implementations, one or more functions of computer program components described herein may be implemented via hardware (e.g., dedicated chip, field-programmable gate array) rather than software. One or more functions of computer program components described herein may be software-implemented, hardware-implemented, or software and hardware-implemented.

The description of the functionality provided by the different computer program components described herein is for illustrative purposes, and is not intended to be limiting, as any of computer program components may provide more or less functionality than is described. For example, one or more of computer program components may be eliminated, and some or all of its functionality may be provided by other computer program components. As another example, processor 11 may be configured to execute one or more additional computer program components that may perform some or all of the functionality attributed to one or more of computer program components described herein.

The electronic storage media of the electronic storage 13 may be provided integrally (i.e., substantially non-removable) with one or more components of the system 10 and/or as removable storage that is connectable to one or more components of the system 10 via, for example, a port (e.g., a USB port, a Firewire port, etc.) or a drive (e.g., a disk drive, etc.). The electronic storage 13 may include one or more of optically readable storage media (e.g., optical disks, etc.), magnetically readable storage media (e.g., magnetic tape, magnetic hard drive, floppy drive, etc.), electrical charge-based storage media (e.g., EPROM, EEPROM, RAM, etc.), solid-state storage media (e.g., flash drive, etc.), and/or other electronically readable storage media. The electronic storage 13 may be a separate component within the system 10, or the electronic storage 13 may be provided integrally with one or more other components of the system 10 (e.g., the processor 11). Although the electronic storage 13 is shown in FIG. 1 as a single entity, this is for illustrative purposes only. In some implementations, the electronic storage 13 may comprise a plurality of storage units. These storage units may be physically located within the same device, or the electronic storage 13 may represent storage functionality of a plurality of devices operating in coordination.

Figure 2:
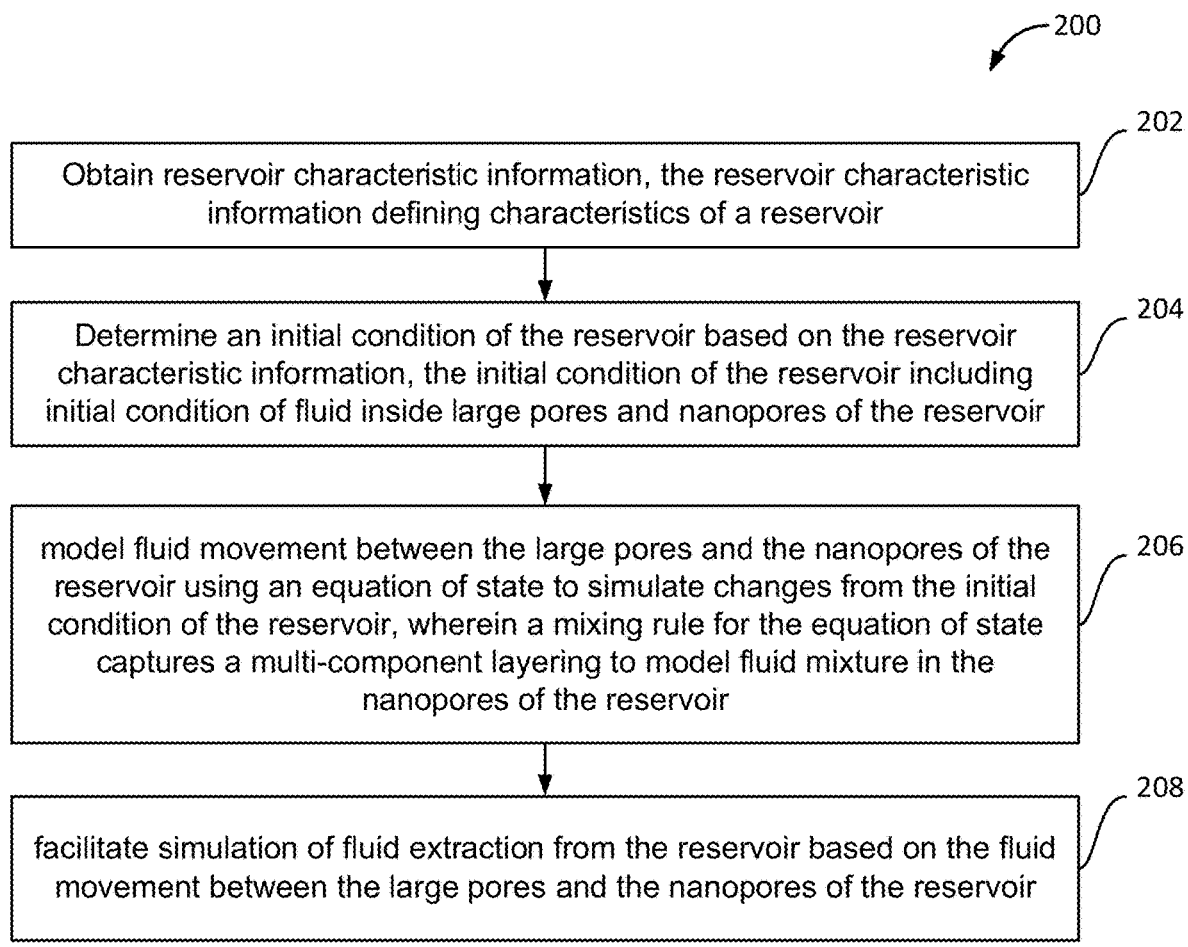
FIG. 2 illustrates an example method for modeling fluid behavior in a reservoir.

FIG. 2 illustrates method 200 for modeling fluid behavior in a reservoir. The operations of method 200 presented below are intended to be illustrative. In some implementations, method 200 may be accomplished with one or more additional operations not described, and/or without one or more of the operations discussed. In some implementations, two or more of the operations may occur substantially simultaneously.

In some implementations, method 200 may be implemented in one or more processing devices (e.g., a digital processor, an analog processor, a digital circuit designed to process information, a central processing unit, a graphics processing unit, a microcontroller, an analog circuit designed to process information, a state machine, and/or other mechanisms for electronically processing information). The one or more processing devices may include one or more devices executing some or all of the operations of method 200 in response to instructions stored electronically on one or more electronic storage media. The one or more processing devices may include one or more devices configured through hardware, firmware, and/or software to be specifically designed for execution of one or more of the operations of method 200.

Referring to FIG. 2 and method 200, at operation 202, reservoir characteristic information and/or other information may be obtained. The reservoir characteristic information may define characteristics of a reservoir. In some implementations, operation 202 may be performed by a processor component the same as or similar to the reservoir component 102 (Shown in FIG. 1 and described herein).

At operation 204, an initial condition of the reservoir may be determined based on the reservoir characteristic information and/or other information. The initial condition of the reservoir may include initial condition of fluid inside large pores and nanopores of the reservoir. In some implementations, operation 204 may be performed by a processor component the same as or similar to the initial condition component 104 (Shown in FIG. 1 and described herein).

At operation 206, fluid movement between the large pores and the nanopores of the reservoir may be modeled using an equation of state to simulate changes from the initial condition of the reservoir. A mixing rule for the equation of state may capture a multi-component layering to model fluid mixture in the nanopores of the reservoir. In some implementations, operation 206 may be performed by a processor component the same as or similar to the fluid movement component 106 (Shown in FIG. 1 and described herein).

At operation 208, simulation of fluid extraction from the reservoir based on the fluid movement between the large pores and the nanopores of the reservoir may be facilitated. In some implementations, operation 208 may be performed using a processor component the same as or similar to the simulation component 108 (Shown in FIG. 1 and described herein).

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A system for modeling fluid behavior in a reservoir, the system comprising:
one or more physical processors configured by machine-readable instructions to:
obtain reservoir characteristic information, the reservoir characteristic information defining characteristics of a reservoir;
determine an initial condition of the reservoir based on the reservoir characteristic information, the initial condition of the reservoir including initial condition of fluid inside large pores and nanopores of the reservoir;
model fluid movement between the large pores and the nanopores of the reservoir using an equation of state to simulate changes from the initial condition of the reservoir, wherein a mixing rule for the equation of state captures a multi-component layering to model fluid mixture in the nanopores of the reservoir and assigns different densities to different types of fluid molecules based on different excess energy for the different types of fluid molecules, excess energy for a type of fluid molecule including additional energy for the type of fluid molecule due to surface interaction with the nanopores of the reservoir, further wherein the assigned densities are modified based on shift of distribution shape of surface-adsorbed fraction functions using a mixture density transition sharpness factor and the modified densities are used in modeling mixing of fluid molecules between multiple layers of surface adsorbed regions within the nanopores of the reservoir;
perform simulation of fluid extraction from the reservoir to predict movement of hydrocarbons between the large pores and the nanopores of the reservoir based on the modeled fluid movement between the large pores and the nanopores of the reservoir and to predict extraction of the hydrocarbons from the reservoir based on the predicted movement of the hydrocarbons between the large pores and the nanopores of the reservoir; and
perform production optimization in the reservoir based on the predicted extraction of the hydrocarbons from the reservoir.

2. The system of claim 1, wherein the modeling of the fluid movement between the large pores and the nanopores includes modeling movement of fluid from the nanopores to the large pores.

3. The system of claim 2, wherein the modeling of the fluid movement between the large pores and the nanopores further includes modeling the movement of fluid from the large pores to the nanopores.

4. The system of claim 1, wherein the simulation of fluid extraction from the reservoir includes simulation of fluid extraction from the large pores of the reservoir.

5. The system of claim 1, wherein the equation of state is a pore-size dependent equation of state.

6. The system of claim 5, wherein a given nanopore of the reservoir includes a given core region and a given surface adsorbed region, and the multi-component layering captured by the mixing rule includes multiple layers within the given surface adsorbed region to model fluid mixture between the multiple layers within the given surface adsorbed region.

7. The system of claim 1, wherein the modified densities are used as weighting factors/terms to adjust original fraction of fluid molecules.

8. The system of claim 1, wherein a tunable parameter provides user-controlled tuning of density by controlling extent to which the excess energy for the type of fluid molecule impacts the assignment of density for the type of fluid molecule.

9. The system of claim 1, wherein surface-adsorbed fraction functions of fluid molecules are determined based on the mixing rule for the equation of state.

10. The system of claim 1, wherein the initial condition of the reservoir is determined further based on equilibrium calculation using the equation of state.

11. A method for modeling fluid behavior in a reservoir, the method comprising:
obtaining reservoir characteristic information, the reservoir characteristic information defining characteristics of a reservoir;
determining an initial condition of the reservoir based on the reservoir characteristic information, the initial condition of the reservoir including initial condition of fluid inside large pores and nanopores of the reservoir;
modeling fluid movement between the large pores and the nanopores of the reservoir using an equation of state to simulate changes from the initial condition of the reservoir, wherein a mixing rule for the equation of state captures a multi-component layering to model fluid mixture in the nanopores of the reservoir and assigns different densities to different types of fluid molecules based on different excess energy for the different types of fluid molecules, excess energy for a type of fluid molecule including additional energy for the type of fluid molecule due to surface interaction with the nanopores of the reservoir, further wherein the assigned densities are modified based on shift of distribution shape of surface-adsorbed fraction functions using a mixture density transition sharpness factor and the modified densities are used in modeling mixing of fluid molecules between multiple layers of surface adsorbed regions within the nanopores of the reservoir;
performing simulation of fluid extraction from the reservoir to predict movement of hydrocarbons between the large pores and the nanopores of the reservoir based on the modeled fluid movement between the large pores and the nanopores of the reservoir and to predict extraction of the hydrocarbons from the reservoir based on the predicted movement of the hydrocarbons between the large pores and the nanopores of the reservoir; and perform production optimization in the reservoir based on the predicted extraction of the hydrocarbons from the reservoir.

12. The method of claim 11, wherein the modeling of the fluid movement between the large pores and the nanopores includes modeling movement of fluid from the nanopores to the large pores.

13. The method of claim 12, wherein the modeling of the fluid movement between the large pores and the nanopores further includes modeling the movement of fluid from the large pores to the nanopores.

14. The method of claim 11, wherein the simulation of fluid extraction from the reservoir includes simulation of fluid extraction from the large pores of the reservoir.

15. The method of claim 11, wherein the equation of state is a pore-size dependent equation of state.

16. The method of claim 15, wherein a given nanopore of the reservoir includes a given core region and a given surface adsorbed region, and the multi-component layering captured by the mixing rule includes multiple layers within the given surface adsorbed region to model fluid mixture between the multiple layers within the given surface adsorbed region.

17. The method of claim 11, wherein the modified densities are used as weighting factors/terms to adjust original fraction of fluid molecules.

18. The method of claim 11, wherein a tunable parameter provides user-controlled tuning of density by controlling extent to which the excess energy for the type of fluid molecule impacts the assignment of density for the type of fluid molecule.

19. The method of claim 11, wherein surface-adsorbed fraction functions of fluid molecules are determined based on the mixing rule for the equation of state.

20. The method of claim 11, wherein the initial condition of the reservoir is determined further based on equilibrium calculation using the equation of state.

* * * * *